United States Patent [19]
Kawai

[11] Patent Number: 6,080,598
[45] Date of Patent: Jun. 27, 2000

[54] METHOD OF PRODUCING SEMICONDUCTOR LASER ELEMENT WITH MIRROR DEGRADATION SUPPRESSED

[75] Inventor: Takahiro Kawai, Tokyo, Japan

[73] Assignee: NEC Corporation, Tokyo, Japan

[21] Appl. No.: 08/778,750

[22] Filed: Jan. 6, 1997

[30] Foreign Application Priority Data

Jan. 5, 1996 [JP] Japan ................................. 8-000175

[51] Int. Cl.$^7$ .............................................. H01L 21/304
[52] U.S. Cl. ............................................. 438/33; 433/38
[58] Field of Search ................................ 438/28, 29, 33, 438/38, 41, 46, 460, 462

[56] References Cited

U.S. PATENT DOCUMENTS

| | | | |
|---|---|---|---|
| 4,769,342 | 9/1988 | Yagi et al. ............................... | 438/3.3 |
| 5,063,173 | 11/1991 | Gasser et al. ............................. | 438/38 |
| 5,144,634 | 9/1992 | Gasser et al. ............................. | 372/49 |
| 5,171,717 | 12/1992 | Broom et al. . | |
| 5,228,047 | 7/1993 | Matsumoto et al. ....................... | 372/46 |
| 5,604,764 | 2/1997 | Motoda et al. ............................ | 372/46 |
| 5,665,637 | 9/1997 | Chand ...................................... | 372/46 |
| 5,773,318 | 6/1998 | Chand et al. ............................. | 438/3.3 |

FOREIGN PATENT DOCUMENTS

| | | |
|---|---|---|
| 52-74292 | 6/1977 | Japan . |
| 54-137991 | 10/1979 | Japan . |
| 64-39789 | 2/1989 | Japan . |
| 3-285327 | 12/1991 | Japan . |
| 5-13878 | 1/1993 | Japan . |
| 5-217970 | 8/1993 | Japan . |

OTHER PUBLICATIONS

Park et al "Passivation of InGaAs/GaAs Vertical–Cavity Surface Emitting Lasers by Amorphous GaAs Deposition", Material Research Society; Apr. 1995, pp. 1013–18.

H. Naito et al., "High–Reliable CW Operation of 100 mW GaAlAs Buried Twin Ridge Substrate Lasers with Nonabsorbing Mirrors", *IEEE Journal of Quantum Electronics* vol. 25, No. 6, Jun. 1989, pp. 1495–1499.

*Primary Examiner*—Savitri Mulpuri
*Attorney, Agent, or Firm*—Sughrue, Mion, Zinn, Macpeak & Seas, PLLC

[57] ABSTRACT

In a method of producing a semiconductor laser element with suppression of mirror degradation by the laser light which can operate stably with a high output power, a laser wafer is prepared to have a layered structure of semiconductor layers including an active layer, followed by forming contact electrodes on the top and the bottom of the wafer, cleaving the wafer in a ultra high vacuum chamber to provide a laser bar, and covering cleaved end faces of the laser bar with semiconductor amorphous layers, as protective layers, of a compound semiconductor material between a third group element and a fifth group element in the element periodic table, to form a protected laser bar. An example of the amorphous layer is of GaAs semiconductor material. Then, a laser element without mirror degradation is obtained by forming dielectric films on the protective layers. Alternatively, the protected laser bar is introduced into a chloride VPE apparatus wherein the protective layers are removed and window layers are formed on the cleaved end faces. Then, dielectric films are formed on the window layers to complete another laser element with mirror degradation suppressed.

17 Claims, 10 Drawing Sheets

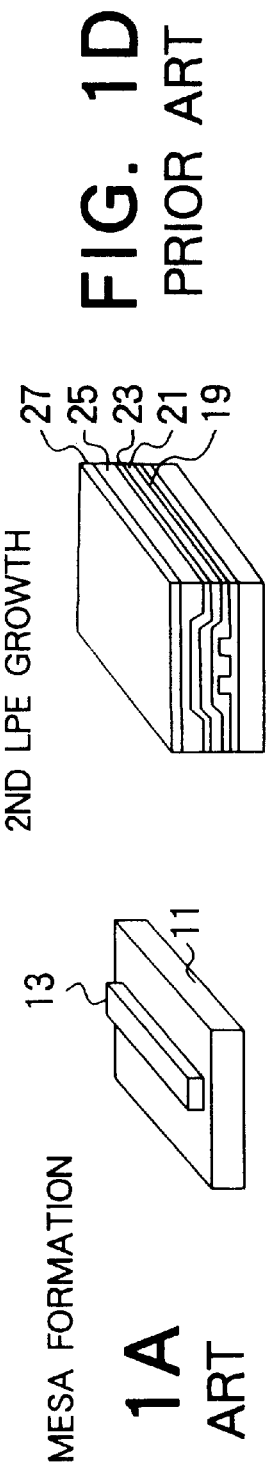
FIG. 1A PRIOR ART
MESA FORMATION
FIG. 1B PRIOR ART
1ST LPE GROWTH
FIG. 1C PRIOR ART
RIDGE FORMATION
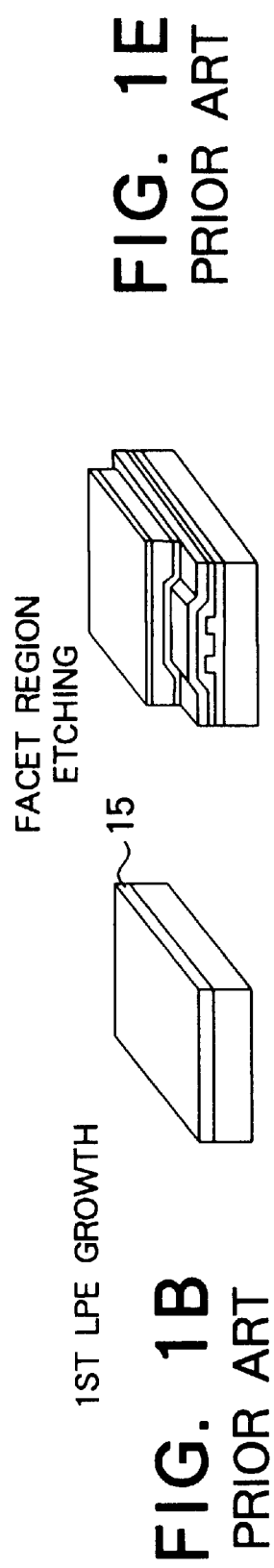
FIG. 1D PRIOR ART
2ND LPE GROWTH
FIG. 1E PRIOR ART
FACET REGION ETCHING
FIG. 1F PRIOR ART
MOCVD GROWTH
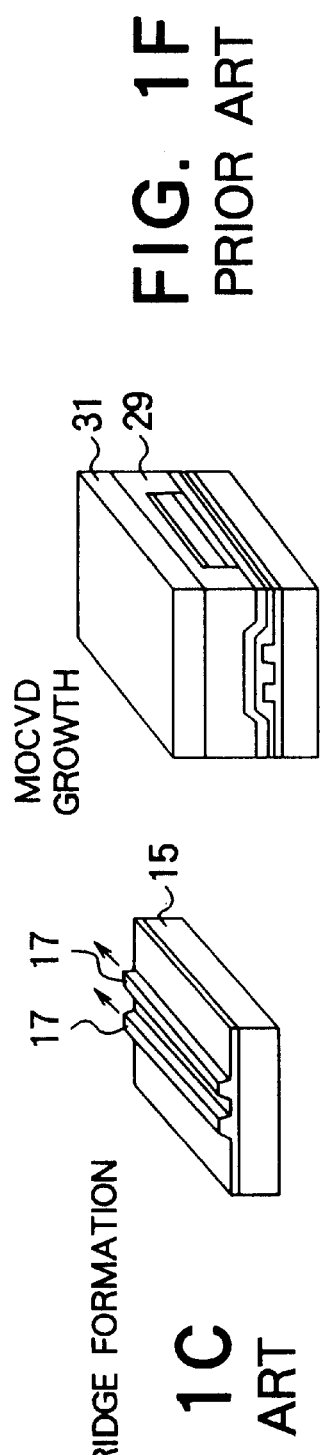

METHOD OF PRODUCING SEMICONDUCTOR LASER ELEMENT WITH MIRROR DEGRADATION SUPPRESSED

BACKGROUND OF THE INVENTION

The present invention relates to a method of producing a semiconductor laser element and, in particular, to suppression of mirror degradation of the semiconductor laser element.

A semiconductor laser element comprises a laser resonator with opposite facet mirrors. The resonator comprises a layered structure including cladding layers and an active layer provided between the cladding layers, all of which layers are made of semiconductors. The resonator is provided with electrode contact layers on the upper most and lowermost layers of the layered structure. A light is excited in the active layer and emitted therefrom through one of the end faces of the resonator.

In a high power laser of the type described, it is known in the art that the laser suffers from mirror degradation to reduce its life time. In detail, the laser light is absorbed at end faces of the resonator due to presence of surface levels to cause a local heating which causes optical damage, or catastrophic optical damage (COD), of the end faces of the resonator. The absorption of light is increased by an occurrence of oxidation and crystal defects. Therefore, the local heating results into the mirror degradation of the resonator. It is needless to say that an increased laser output power causes considerable rise of temperature at the end faces of the resonator.

In order to suppress the local heating by the laser light absorption, there have been known in the art various window structures each being formed around opposite end faces of the resonator. The window structure comprises a window layer formed at the end of the active layer. The window layer is an epitaxially grown layer of a semiconductor material with a forbidden band wider than that of the active layer.

It is disclosed in IEEE Journal of Quantum Electronics, vol. 25, No.6, June 1989, pages 1495 to 1499 (Reference I), that the active layer is removed from the regions around both facets of the large optical cavity together with the upper and lower layers thereof. Then, in the removed regions, an upper cladding layer is regrown to form the window layer.

The arrangement of Reference I has problems that the laser element is complex in its structure and in the window forming process which comprises steps of patterning, selective etching, and regrowing. In the window forming process of the semiconductor laser which uses semiconductor materials containing Al (aluminum), a strong oxide film is formed at an interface with the regrown layer whereby the window structure is accompanied with many surface levels. This is because the active layer is exposed to the air after the selective etching before the regrowing. Since presence of the surface levels increases the light absorption, the catastrophic optical damage (COD) is not expected to be well suppressed.

Unexamined Japanese Patent Application Publication No. Hei 5-13878 (JP-A 5-13878) (Reference II) discloses a semiconductor laser element where a window layer is provided between each of the end faces of the resonator and an end protective layer. The window layer is of a semiconductor material having a forbidden band larger than that of the active layer of the resonator in the band width and has a thickness to prevent occurrence of any local lattice defect caused by lattice mismatching rate or lattice inconsistency between the semiconductor materials of the window layer and the active layer at the interface therebetween. In practice, the active layer and the window layer are described made of $Al_xGa_{1-x}As$ and $Al_zGa_{1-z}As$, respectively. In producing processes of the semiconductor laser element using the Al-containing semiconductor materials, the end faces of the resonator cleaved in the air are accompanied by oxide layers which are formed by natural oxidization during the cleaving step in the air. The oxide layers are too strong so that they are difficult to be perfectly removed before growing the window layers. This makes it difficult to form the window layers without any surface level.

Further, in Reference II, electrode layers are formed after the cleavage followed by the formation of the window layers on the cleaved end faces. This means that the laser element according to Reference II has another problem that formation of electrode layers is a difficult operation because the electrode materials come into contact with the active layer.

U.S. Pat. No. 5,063,173 or No. 5,144,634 (Reference III) discloses a semiconductor laser element wherein end faces of the resonator formed by cleaving is coated by amorphous layer of Si, Ge, or Sb, as a passivation layer, to lower the degradation of the semiconductor laser element. However, Si, Ge or Sb is readily diffused into the semiconductor materials such as Al—Ga—As of the active layer and other layers of the semiconductor laser resonator, so that the laser resonator is degraded in its performance by the diffusion.

SUMMARY OF THE INVENTION

Accordingly, it is an object of the present invention to provide a method of producing a semiconductor laser element which can stably radiates a high power laser light without the mirror degradation for a long life time.

It is another object of the present invention to provide a method of producing a semiconductor laser element, which can be easily produced with a high yield.

It is a specific object of the present invention to provide a semiconductor laser element having a laser resonator without its mirror degradation.

The present invention is directed to a method of producing a semiconductor laser element comprising a laser resonator with opposite end faces as mirror facets, the laser resonator having an layered structure of semiconductor materials including an active layer and upper and lower layers of the active layer, the resonator having first and second contact electrodes formed on top and bottom thereof. The method according to the present invention comprises steps of: preparing a wafer having the layered structure; forming the first and second contact electrodes onto the top and the bottom of the wafer to supply an electrode added wafer; introducing the electrode added wafer into a ultra high vacuum chamber; cleaving the electrode added wafer along a predetermined lines in the ultra high vacuum chamber to produce a laser bar with opposite end faces as cleaved; covering the end faces with protective layers during maintaining the laser bar in the ultra high vacuum chamber before the end face is oxidized, to supply a protected laser bar, each of the protective layers being an amorphous layer of a compound semiconductor material between a third group element and a fifth group element in the element periodic table.

The method may further comprises a step of forming dielectric films on the protective layers, respectively, first one of the dielectric films being of a first dielectric material providing a first light reflectance, the other of the dielectric films being of dielectric materials providing a second light reflectance higher than the first light reflectance.

Alternatively, the method of the present invention as may further comprises steps of: introducing the protected laser bar into a non-oxidizing chamber; removing the protective layers to expose the end faces of the laser bar in the non-oxidizing chamber; forming window layers on the exposed end faces maintained contamination free and oxide free, in the non-oxidizing chamber, each of the window layers being a single crystal semiconductor material which has a forbidden band larger than that of the active layer in the width. Then, there may be added a step of forming dielectric films on the window layers, respectively, first one of the dielectric films being of a first dielectric material providing a first light reflectance, the other of the dielectric films being of dielectric materials providing a second light reflectance higher than the first light reflectance.

According to another aspect of the present invention, there is a provided a method of producing a semiconductor laser element comprising a laser resonator with opposite end faces as mirror facets, the laser resonator having an layered structure of semiconductor materials including an active layer and upper and lower layers of the active layer, the resonator having first and second contact electrodes formed on top and bottom thereof. The method comprising steps of: preparing a wafer having the layered structure; forming the first and second contact electrodes onto the top and the bottom of the wafer to supply an electrode added wafer; introducing the electrode added wafer into a ultra high vacuum chamber; cleaving the electrode added wafer along a predetermined lines in the ultra high vacuum chamber to produce a laser bar with opposite end faces as cleaved; covering the end faces with window layers during maintaining the laser bar in the ultra high vacuum chamber before the end face is oxidized, each of the window layers being a single crystal semiconductor material which have a forbidden band larger than that of the active layer in the width.

According to the present invention, a semiconductor laser element is obtained which comprises: a laser resonator with opposite end faces as mirror facets, the laser resonator having a layered structure of semiconductor materials including an active layer and upper and lower layers of the active layer, the resonator having first and second contact electrodes formed on top and bottom thereof; and protective layers formed on the end faces which are contamination-free and oxide-free, each of the protective layers being an amorphous layer of a compound semiconductor material between a third group element and a fifth group element in the element periodic table.

The semiconductor laser element may further comprise dielectric films formed on the protective layers, respectively, first one of the dielectric films being of a first dielectric material providing a first light reflectance, the other of the dielectric films being of dielectric materials providing a second light reflectance higher than the first light reflectance.

BRIEF DESCRIPTION OF THE DRAWINGS

FIGS. 1A to 1F are perspective views of layered structures of different steps for explaining a known method of producing a semiconductor laser element disclosed in Reference I;

DESCRIPTION OF THE PREFERRED EMBODIMENTS

Figure 2:
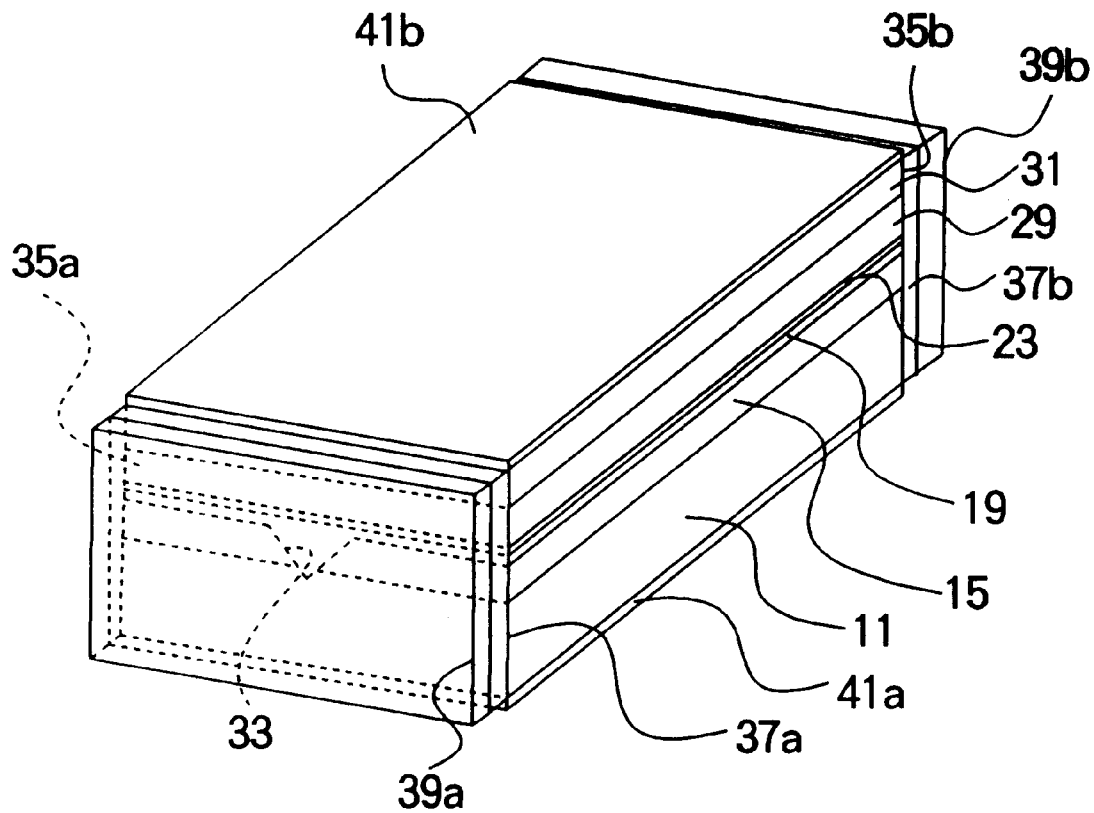
FIG. 2 is a perspective view of a known semiconductor laser element disclosed in Reference II.

For a better understanding of the present invention, description will first be made as regards a method of producing a conventional semiconductor laser element with reference to FIGS. 1A to 3.

Referring to FIGS. 1A to 1F, the semiconductor laser element disclosed in Reference I is produced by the following steps.

In FIG. 1A, a mesa stripe 13 is formed on a p-GaAs substrate 11.

In FIG. 1B, a current blocking layer 15 of n-GaAs is grown on the substrate having the mesa stripe 13 by a first liquid phase epitaxy (LPE) growth.

In FIG. 1C, a pair of ridges 17, 17 are formed by etching the blocking layer 15.

In FIG. 1D, a cladding layer 19 is formed of p-$Ga_{0.59}Al_{0.41}As$ on the ridge 17. Furthermore, a guide layer 21 is formed of p-$Ga_{0.69}Al_{0.31}As$ on the cladding layer 19. On the guide layer 21, an active layer 23 is formed of p-$Ga_{0.92}Al_{0.08}As$. On the active layer 23, a confinement layer 25 is formed of n-$Ga_{0.5}Al_{0.50}As$. On the confinement layer 25, a buffer layer 27 is formed of n-$Ga_{0.80}Al_{0.20}As$. Those five layers are formed by a second LPE growth.

In FIG. 1E, upper three layers are selectively etched down to the guide layer at the facet regions to form a window region.

In FIG. 1F, a cladding layer 29 is regrown at the window regions which is formed of n-$Ga_{0.5}Al_{0.50}As$. On the cladding layer 29, a contact layer 31 is formed of n-GaAs by a process of MOCVD (Metal Organic Chemical Vapour Deposition).

Thereafter, laser elements of a cavity length are formed by cleavage and then facet coating.

The semiconductor laser element thus produced has problems as described in the preamble.

Referring to FIG. 2, a semiconductor laser element of Reference II will be described below.

In FIG. 2, a substrate 11 is made of p-GaAs semiconductor. On the substrate 11, a current blocking layer 15 is formed of n-GaAs. On the blocking layer 15, a cladding layer 19 is formed of p-$Al_yGa_{1-y}As$, wherein y is a number less than 1. On the cladding layer 19, an active layer 23 is formed of p-$Al_xGa_{1-x}As$, wherein x is a number not larger than y. On the active layer 23, another cladding layer 29 and a contact layer 31 are formed of p-$Al_yGa_{1-y}As$ and n-GaAs, respectively.

A V-shape groove 33 is formed to have a depth from the blocking layer 15 to the substrate 11, by a photolithography process and a chemical etching process. On end faces 35a and 35b of the resonator, are formed the window layers 37a and 37b on which dielectric films 39a and 39b are formed, respectively.

In detail, each of the end faces 35a and 35b are made by cleaving, and then, are formed with the window layers 37a and 37b grown by the process of MOCVD. Each of the window layers has a forbidden band wider than that of the active layer 23.

Thereafter, p-side and n-side contact electrodes 41a and 41b are formed on upper and lower surfaces of the resonator. The formation of the electrodes is required to be carefully carried out sufficiently to suppress the electrode material from flowing to the active layer. This makes production of the laser element difficult.

Figure 3:
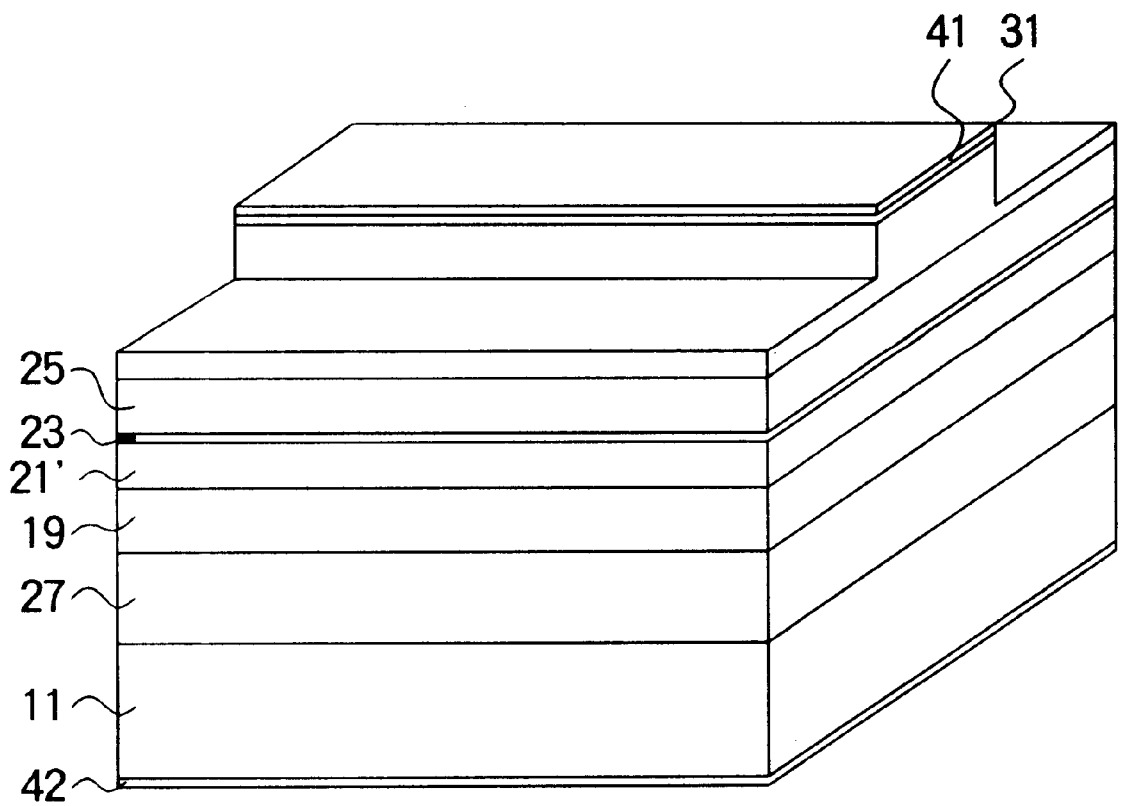
FIG. 3 is a perspective view of a known laser bar disclosed in Reference III.

Referring to FIG. 3, description will be made as to a semiconductor laser element disclosed in Reference III below.

Layers are thoroughly grown on an $n^+$ doped GaAs substrate 11 by the molecular beam epitaxy. A buffer layer 27 is grown of n-doped GaAs on the substrate 11, followed by a lower n-type cladding layer 19 of $Al_{0.45}Ga_{0.55}As$. The core of the laser consists of a graded n-type region 21' of $Al_{0.45}Ga_{0.55}As$ graded towards $Al_{0.18}Ga_{0.82}As$, an undoped region 23 forming a quantum well of GaAs, a graded p-type region 25 of $Al_{0.45}Ga_{0.55}As$, and finally a $p^+$ GaAs contact layer 31 with doping density sufficiently high to allow a titanium-platinum-gold electrode 41 to make good ohmic contact. A second ohmic contact 42 at the bottom of n-type substrate 11 is obtained by alloying germanium, gold, and nickel.

The laser bar thus formed is placed in a ultra high vacuum chamber and cleaved to form a first and second mirror facets, i.e. first and second end faces of resonator. Thereafter, amorphous silicon layer is deposited on the first end face by E-beam vaporization process. In a similar manner, another silicon layer is deposited on the second end face by E-beam vaporization process.

The semiconductor laser element thus formed according to Reference III has problems as described in the preamble.

Now, description will be made as regards a first preferred embodiment according to the present invention with reference to FIGS. 4 to 10.

The semiconductor laser element according to the present embodiment has a strain quantum structure and is a transverse mode control type of an oscillating wave length of 0.98 $\mu$m (micrometer).

Figure 4:
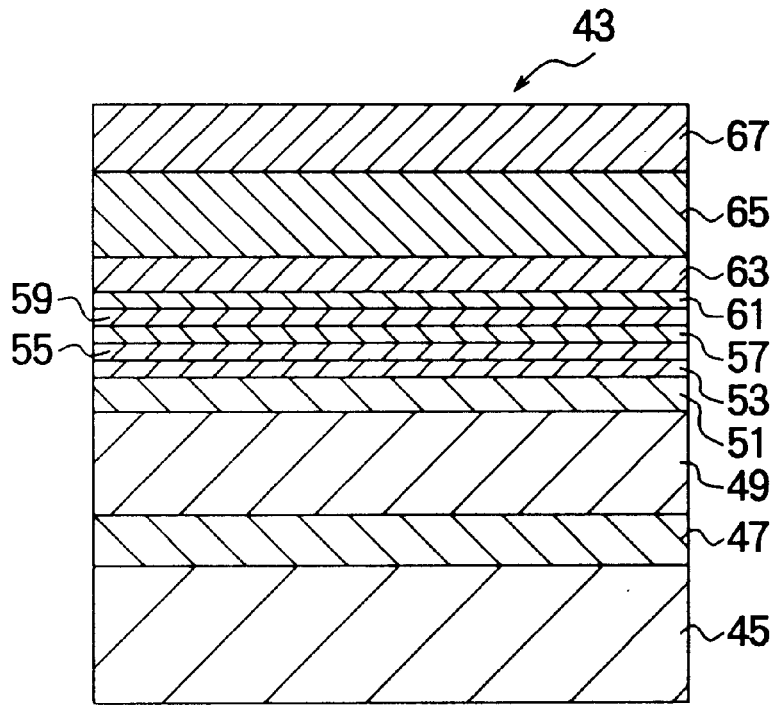
FIG. 4 is a cross sectional view of a layered structure of a semiconductor wafer at a producing step according to one embodiment of the present invention, only showing the structure for a single element.
Figure 5:
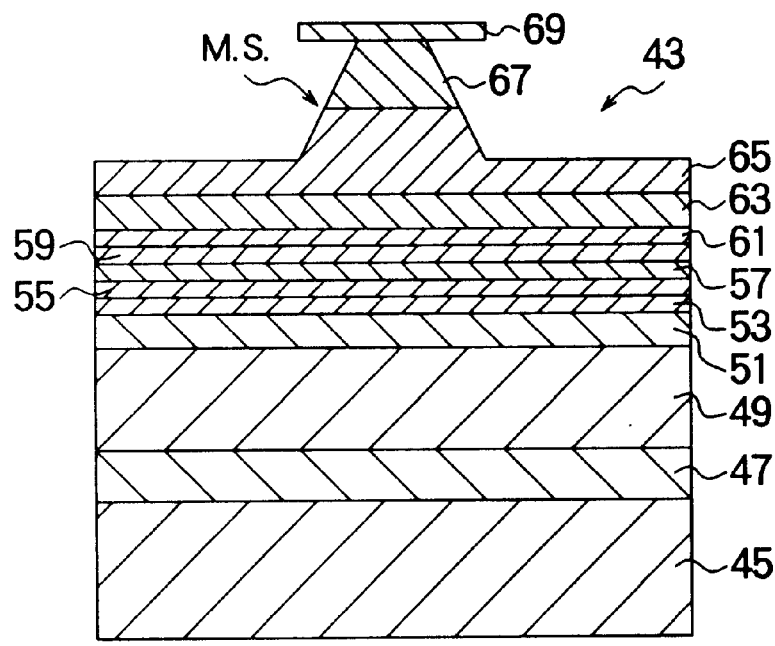
FIG. 5 is a cross sectional view of the semiconductor wafer at another step progressed from FIG. 4, showing a SiO2 stripe formed by selective etching.
Figure 6:
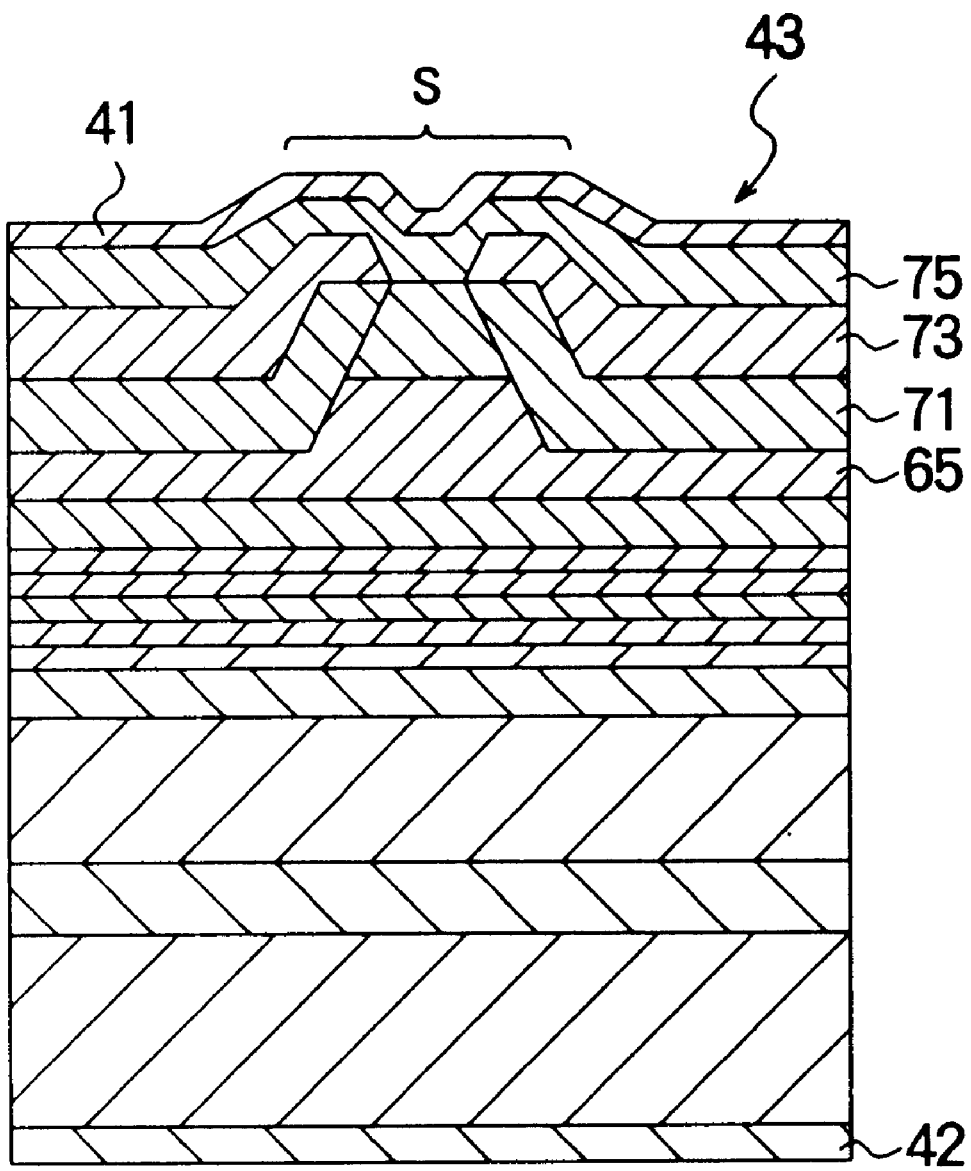
FIG. 6 is a cross sectional view of the semiconductor wafer completed.

Referring to FIG. 4, a semiconductor laser wafer 43 has a layered structure illustrated therein. For the sake of simplification, there is shown the structure for a single semiconductor element, although the semiconductor wafer is provided with the structures for a plurality of laser elements. FIGS. 5 and 6 also show sections for a single laser element.

The wafer 43 is formed by processes using an MOVPE (Metal Organic Vapor Phase Epitaxy) apparatus at the normal pressure. That is, layers 45–67 are sequentially formed in a stacked layer structure.

On a (100) substrate 45 of Si-doped GaAs, a buffer layer 47 is formed of Si-doped GaAs up to a thickness of 0.5 $\mu$m with an impurity concentration of $1 \times 10^{18}$ cm$^{-3}$.

The semiconductor of Si-doped GaAs will be represented by a formula of GaAs:Si, and the other doped semiconductors described below will also be represented by the similar formulae.

On the buffer layer 47, a cladding layer 49 is formed of $Al_{0.4}Ga_{0.6}As$:Si with a thickness of 2 $\mu$m with an impurity concentration of $1 \times 10^{17}$ cm$^{-3}$. Both of the layers are grown at a temperature of 700° C. and at a ratio of 100 of a fifth group element to a third group element (V/III) in the element periodic table.

Next, at a grown temperature of 660° C. at a V/III ratio of 80, a light guide layer 51 is formed of $Al_{0.2}Ga_{0.8}As$ with a thickness of 40 nm.

In a similar manner, a first barrier layer 53 is formed of GaAs with a thickness of 20 nm. A first active layer 55 is formed of $In_{0.24}Ga_{0.76}As$ with a thickness of 4.5 nm. A second barrier layer 57 is formed with a thickness of 5 nm. A second active layer 59 is formed of $In_{0.24}Ga_{0.76}As$ with a thickness of 5 nm. A third barrier layer 61 is formed of GaAs with a thickness of 20 nm.

Succeedingly, a light guide layer 63 is formed of $Al_{0.4}Ga_{0.6}As$ with a thickness of 40 nm. A cladding layer 65 is formed of $Al_{0.4}Ga_{0.6}$:Mg up to a thickness of 1.5 $\mu$m with an impurity concentration of $1 \times 10^{18}$ cm$^{-3}$. A cap layer 67 is formed of GaAs:Mg with a thickness of 1 $\mu$m. These layers are sequentially formed by the vapor phase epitaxy.

Next, description will be made as regards processes for working the semiconductor laser wafer 43 shown in FIG. 4 to a transverse mode controlling type laser with reference to FIGS. 5 and 6.

FIG. 5 shows a cross section of the semiconductor laser wafer taken in the ($\bar{1}10$) surface, the wafer being formed with a mesastripe (M.S.) elongated in a direction of the crystal axis of [$\bar{1}10$].

First, a $SiO_2$ film 69 is formed on the cap layer 67 of GaAs which is the top layer of the semiconductor laser wafer in FIG. 4. The $SiO_2$ film is partially removed by a photolithographic technic to form a stripe 69 of $SiO_2$ with a width of 4 $\mu$m in a direction of [$\bar{1}10$] shown in FIG. 5. Using the $SiO_2$ stripe 69 as a mask, the cladding layer 65 and the cap layer 67 are etched to a depth by a selective etching so that the cladding layer 65 is remained by a thickness of 0.3 $\mu$m, while a portion of the cap layer 67 and a portion of the cladding layer 65 being remained under the $SiO_2$ stripe 69 to form the mesastripe (M.S.).

Referring to FIG. 6, by a selective growing technic using the $SiO_2$ stripe 67 as a mask, a first current blocking layer 71 is grown on the cladding layer 65 and on the side of the mesastripe (M.S.), and then a second current blocking layer 73 is formed on the first current blocking layer 71. The first current blocking layer 71 is made of $Al_{0.6}Ga_{0.4}As$:Si which has a thickness of 0.8 $\mu$m and an impurity concentration of $1 \times 10^{18}$ cm$^{-3}$. The second current blocking layer 73 is made of GaAs:Si which has a thickness of 0.8 $\mu$m and an impurity concentration of $1 \times 10^{18}$ cm$^{-3}$. After the $SiO_2$ mask is removed, a cap layer 75 is grown of GaAs:Mg with an impurity concentration of $1 \times 10^{19}$ cm$^{-3}$ and with a thickness of 1 $\mu$m.

Thereafter, a first contact electrode 41 is formed of Ti-platinum-gold alloy on the cap layer 75, while a second contact electrode 42 is formed of Ni—Ge alloy on the lower surface of the substrate. Thus, the laser wafer is completed which includes the layered structure for a semiconductor laser element of the transverse mode controlling type.

As will be apparent from FIG. 6, the wafer 43 which has been formed with the cap layer 75 and the first contact electrode 41 has two parallel projection strips (S) on a top surface thereof along parallel side edges of the mesastripe (M.S.).

Now, description will be made as regards formation of opposite end faces or mirror facets of a semiconductor resonator from the wafer 43 and deposition of protection layers on the end faces within an ultra high vacuum with reference to FIGS. 7A to 9. The protection layer is a layer for protecting the mirror facets from oxidation.

Figure 7A:
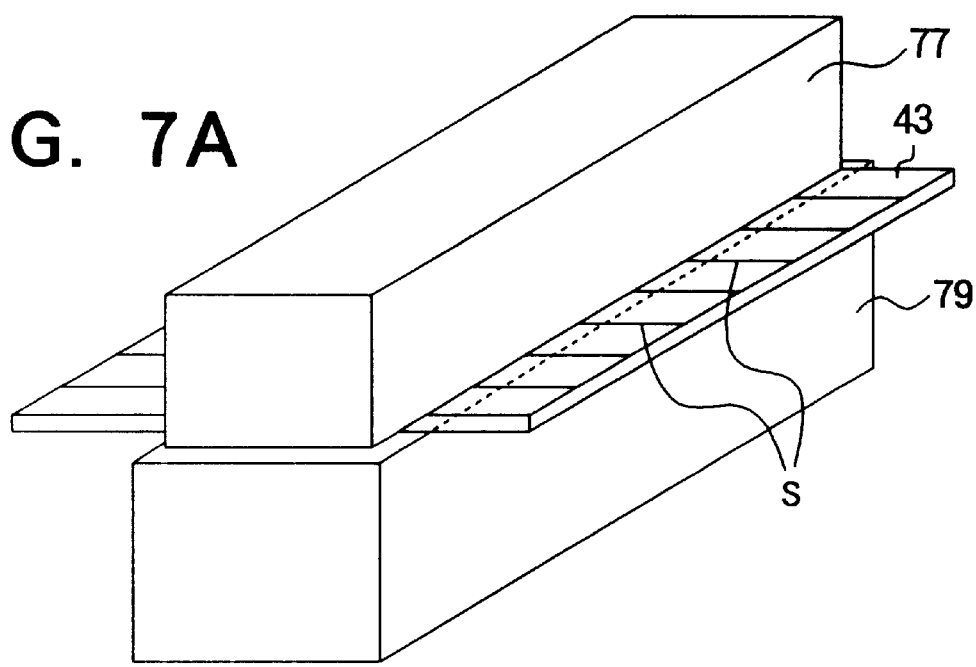
FIGS. 7A and 7B are for illustrating a cleaving operation of the completed wafer, FIG. 7A being a perspective view illustrating the wafer supported by supporting jigs, and FIG. 7B being a cross sectional view for illustrating the cleaving operation of the wafer thus supported.
Figure 7B:
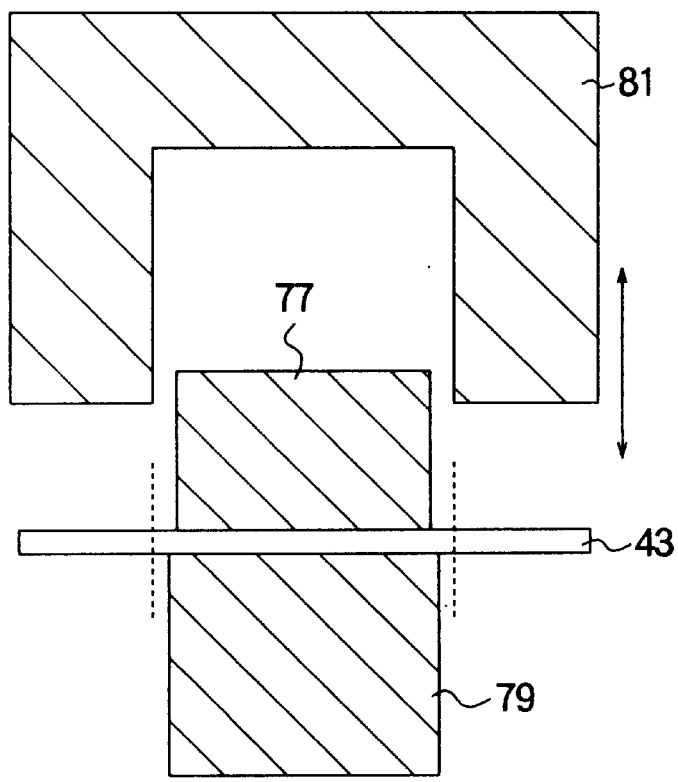

Referring to FIGS. 7A and 7B, the semiconductor laser wafer 43 as formed in FIG. 6 is fixedly held or supported by supporting jigs 77 and 79.

In FIG. 7A, the wafer 43 is shown to have structures for a plurality of laser elements by illustrating a plurality of solid lines each representing the two projection strips (S) for each of the laser elements.

Then, a pressing force is applied onto opposite free side portions of the semiconductor laser wafer 43 by a pressing block 81 within a chamber with a ultra high vacuum of $10^{-10}$ Torr order in which MBE, i.e. molecular beam epitaxy, is possible. The semiconductor laser wafer 43 is cleaved along portions represented by dotted lines in the figures, so that a semiconductor laser bar 43' is obtained with a resonator length of 700 μm and opposite cleaved end surfaces.

Figure 8:
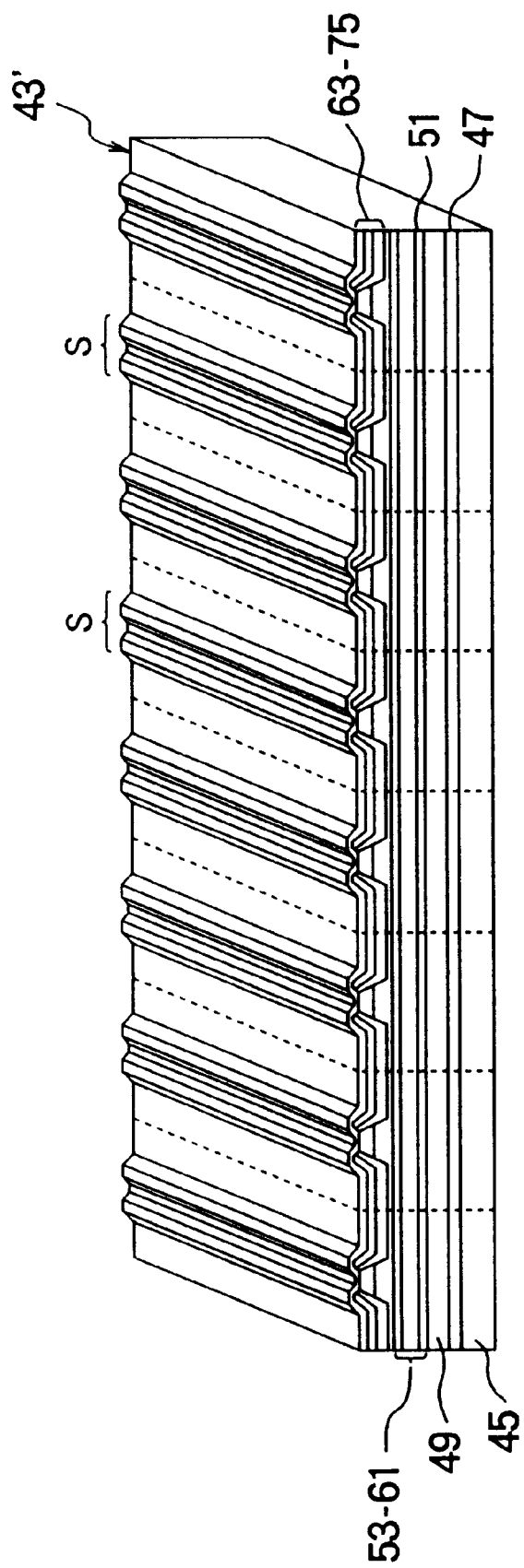
FIG. 8 is a perspective view of a laser bar which has been cleaved from the wafer.

Referring to FIG. 8, the obtained laser bar 43' has a continuous and repeated pattern of the layered structure for a plurality of laser elements having the projection strips S, which laser elements will be cut away to each other along dotted lines shown in the figure at the following step to form independent elements.

Figure 9:
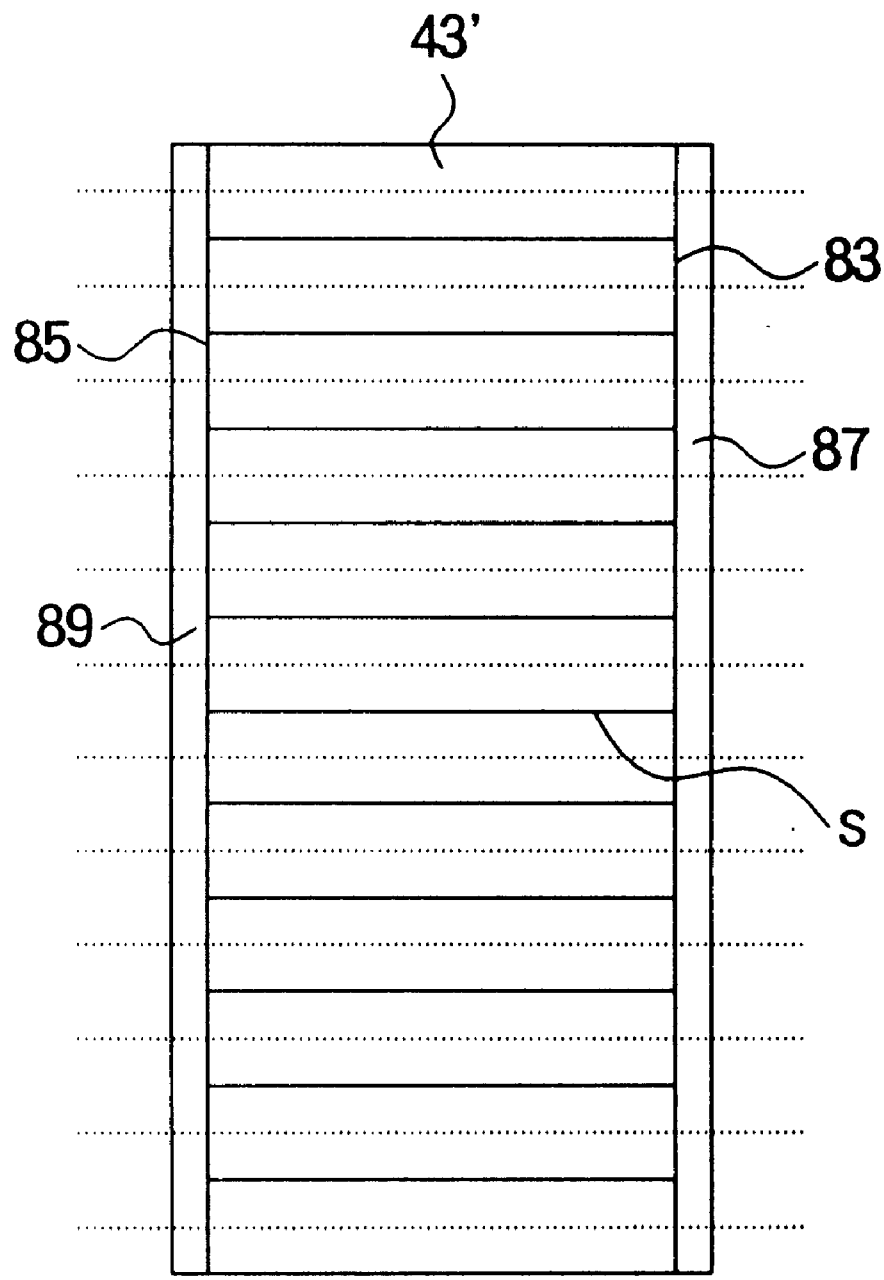
FIG. 9 is a plan view of the laser bar with protective amorphous layers formed on cleaved end faces.

Referring to FIG. 9, on the cleaved end faces 83 and 85 which are not yet oxidized after cleaving, amorphous layers 87 and 89 of GaAs are formed, as the protective layers, with a thickness of 10 nm by the MBE process within the ultra high vacuum chamber at the room temperature. In the actual practice, one of the amorphous layer 87 is at first on one of the end faces, then, the laser bar 43' is turned over to form the other amorphous layer 89 onto the other end face.

When the laser bar 43' is taken out into the air, the amorphous layers 87 and 89 are oxidized at their surfaces. However, the end faces 83 and 85 obtained by cleaving are protected from oxidation by the amorphous layers 87 and 89.

As mentioned above, the semiconductor laser bar 43' is covered with the amorphous layers 87 and 89 of GaAs on the end faces 83 and 85 of the resonator and has no interfacial level owing to oxidation of the end faces. Accordingly, the suppression of the COD can effectively be achieved by the known passivation procedure using the usual dielectric films, that is, the dielectric films being formed onto the amorphous layers.

Figure 10:
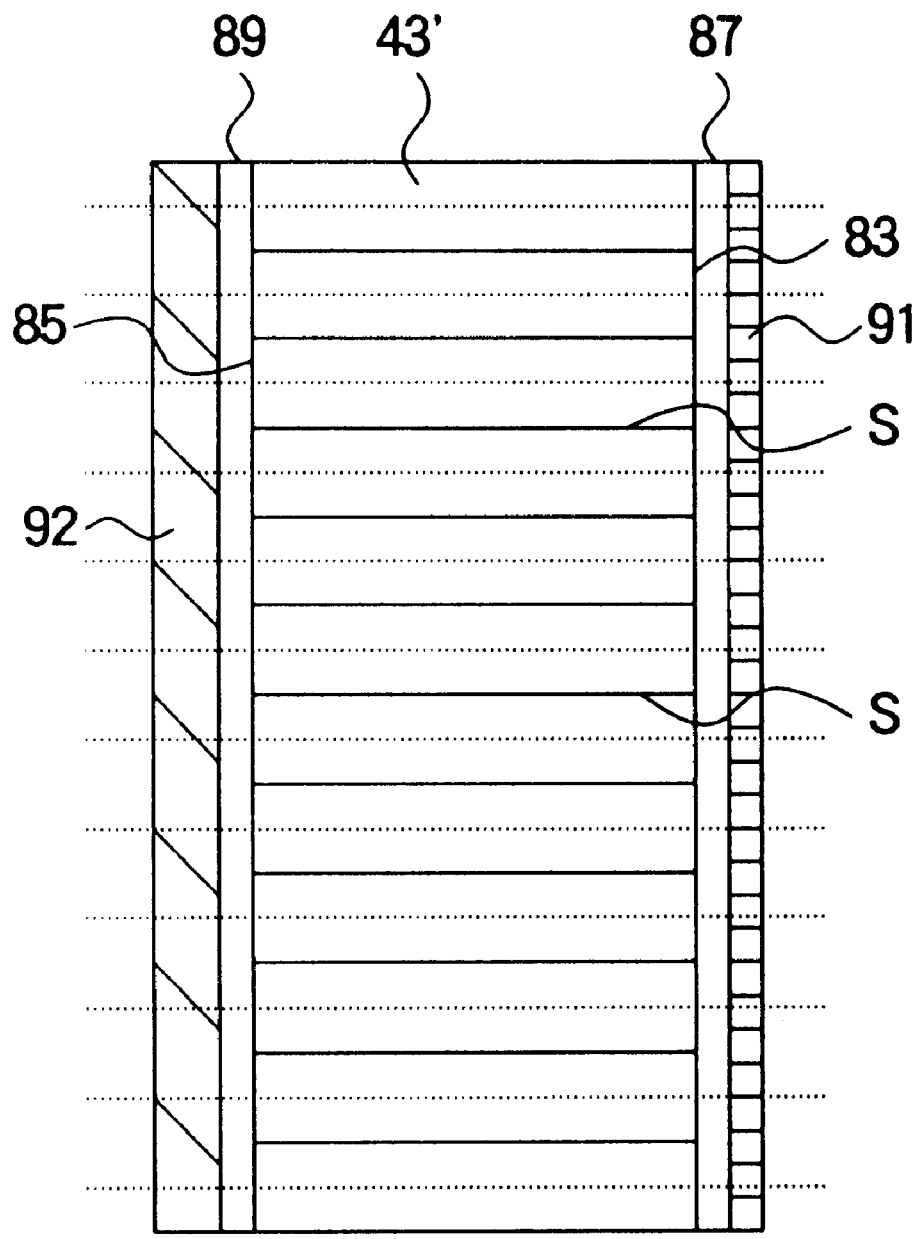
FIG. 10 is a plan view of the laser bar with dielectric films formed on the protective amorphous layers.

Referring to FIG. 10, in order to insure reliability for a long period with an output power of 150 mW, dielectric coatings 91 and 92 are formed onto the amorphous layers 87 and 89 for obtaining reflectance of 3% and 95% at opposite end faces of the resonator, respectively. One of the dielectric coatings 91 is a single layer film consisting of a compound selected from the group of $Al_2O_3$, $SiN_4$, and $SiO_2$. The other coating 92 is a multilayer film which consists of $Al_2O_3$ and amorphous silicon.

Thereafter, the semiconductor laser bar 43' is divided into individual laser elements along cutting lines shown by dotted lines in FIG. 10. Each of the laser element is fused onto a heat sink to complete the semiconductor laser device.

In order to realize a semiconductor laser element with a reliability in operation with a high output power higher than 150 mW, it is important to suppress the light absorption due to presence of the interfacial levels at the end faces. The window structure is effective to suppress the light absorption.

The semiconductor element according to the second embodiment is provided with the window structure in place of the amorphous layers.

The window structure is formed as follows.

After formation of the amorphous layers 83 and 85 of GaAs as shown in FIG. 9, the semiconductor laser bar 43' is introduced into a chloride VPE (Vapor Phase Epitaxy) apparatus. In the apparatus, the amorphous layer 87 and 89 of GaAs are etched and removed by HCl gas at a substrate temperature of 400° C.

Although the amorphous layers 87 and 89 of GaAs are oxidized on the surface in the air, the end faces 83 and 89 of the resonator are protected from oxidization. Therefore, after removing amorphous layers 87 and 89 of GaAs, the end faces 83 and 85 can be obtained as clean surfaces which have no oxide. Onto the clean end faces of the resonator, GaAs single crystals 95 and 97 are grown, as window layers, with a thickness of 50 nm at a substrate temperature of 380° C. by alternately supplying materials of individual elements of the third group and the fifth group thereonto. Thus, the window structures can be formed onto the end faces of the resonator.

The MOVPE apparatus is high in the decomposition temperature of the raw materials and cannot carry out the crystal growth at a temperature lower than 500° C. This makes it difficult to form contact electrodes on the laser bar prior to formation of the window structures. However, crystal growth can be performed at a temperature of 400° C. or less in the chloride VPE apparatus. Therefore, contact electrodes are permitted to be formed onto the laser bar prior to the formation of the window structures. Further, the flat semiconductor crystal with high quality can be formed by supplying the III and V group elements.

Alternatively, the window layers can be directly formed without formation of the protective layers on the end surfaces as follows.

In the ultra high vacuum chamber, the laser wafer is cleaved to form the laser bar 43' as described above. Then, without depositing the amorphous layers 87 and 89 of GaAs, the semiconductor laser bar 43' are heated at 350° C. and alternately supplied with molecular beams of As and Ga onto the end faces to grow a single crystal layers, as window layers, onto the end faces.

For the window layer which is grown on the end face of the resonator, various materials can be selected depending on materials for the active layer. Table 1 shows an appropriate combination between materials for the window layer and the active layer. The window layer is made as a single layer of a single material but can be made as a multilayer of a plurality of materials, such as GaP/GaAs, GaP/InP, and GaP/InP/GaAs.

TABLE 1

| ACTIVE LAYER | WINDOW LAYER |
| --- | --- |
| InGaAs | GaAs, AlGaAs, InGaP, AlGaInP, GaP |
| GaAs | AlGaAs, InGaP, AlGaInP, GaP |
| InGaP | AlGaInP, GaP |

Figure 11:
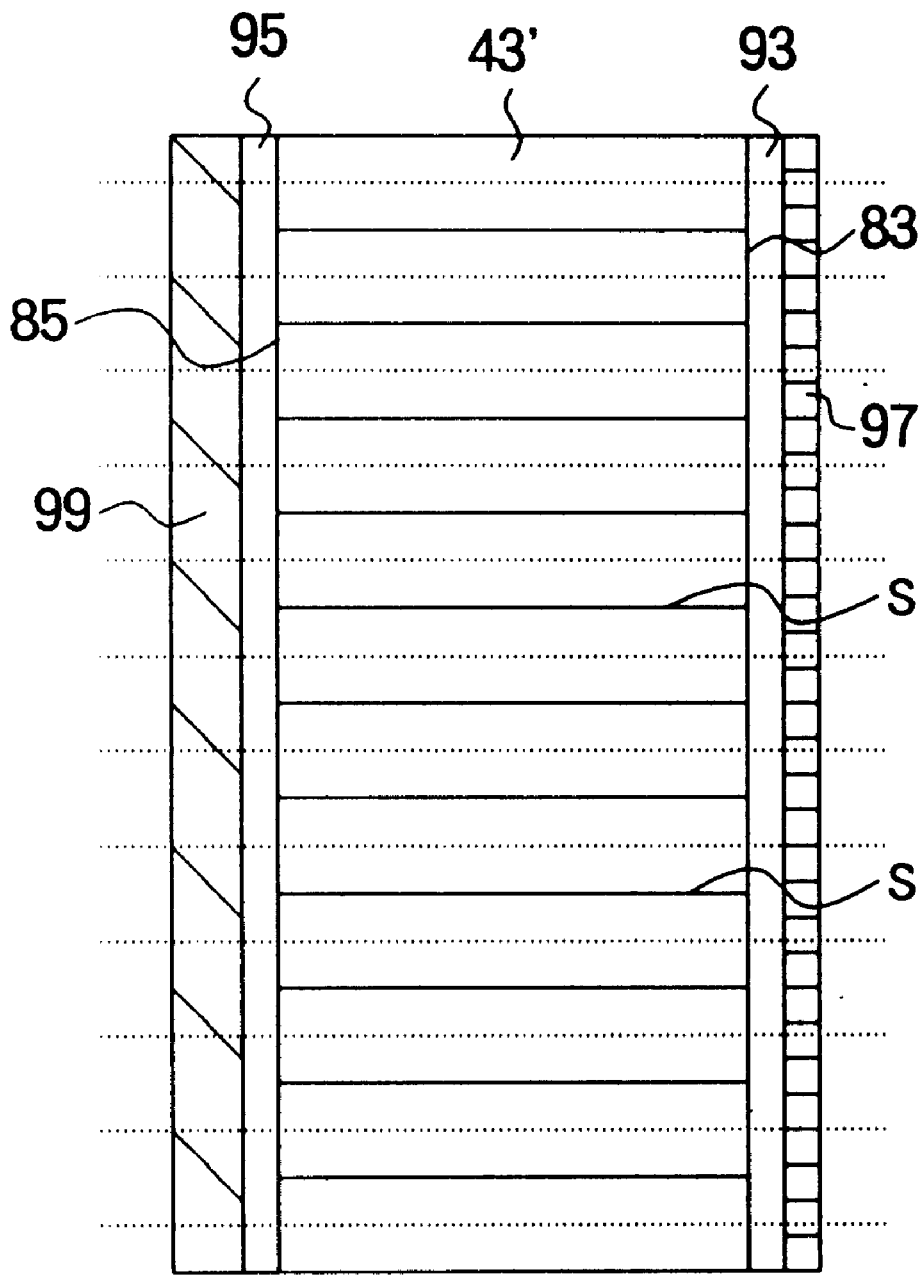
FIG. 11 is a plan view of another laser bar wherein window layers are formed between the cleaved end faces and the dielectric films in place of the protective amorphous layers.

As shown in FIG. 11, on the window layers 93 and 95, dielectric films 97 and 99 are formed which have reflectance of 3% and 95%. Each of the dielectric films 97 and 99 may be a single layer film made of one material selected from the group consisting of $Al_2O_3$, $SiN_4$, and $SiO_2$. Each of the dielectric films 97 and 99 may be a multilayer film of $Al_2O_3$/amorphous silicon.

Finally, the laser bar 43' is also divided into individual laser elements along the cutting lines represented by dotted lines in the figure. Each of the laser elements is fused onto a heat sink to complete the laser device.

What is claimed is:

1. A method of producing a semiconductor laser element comprising a laser resonator with opposite end faces as mirror facets, said laser resonator having an layered structure of semiconductor materials including an active layer and upper and lower layers of said active layer, said resonator having first and second contact electrodes formed on top and bottom thereof, said method comprising steps of:

preparing a wafer having said layered structure;

forming the first and second contact electrodes onto the top and the bottom of the wafer to supply an electrode added wafer;

introducing said electrode added wafer into a ultra high vacuum chamber;

cleaving said electrode added wafer along a predetermined lines in said ultra high vacuum chamber to produce a laser bar with opposite end faces as cleaved;

covering said end faces with protective layers during maintaining said laser bar in said ultra high vacuum chamber before said end face is oxidized, to supply a protected laser bar, each of said protective layers being an amorphous layer of a compound semiconductor material between a third group element and a fifth group element in the element periodic table.

2. The method as claimed in claim 1, wherein said amorphous layer is of GaAs semiconductor material.

3. The method as claimed in claim 1, which further comprises a step of forming dielectric films on said protective layers, respectively, first one of said dielectric films being of a first dielectric material providing a first light reflectance, the other of said dielectric films being of dielectric materials providing a second light reflectance higher than said first light reflectance.

4. The method as claimed in claim 3, wherein said first dielectric material is a single layer of one compound selected from a group of $Al_2O_3$, $SiN_4$, and $SiO_2$.

5. The method as claimed in claim 3, wherein said second dielectric film is a multilayer comprising a sublayer of $Al_2O_3$ and another sublayer of Si amorphous.

6. The method as claimed in claim 1, which further comprises steps of:

introducing said protected laser bar into a non-oxidizing chamber;

removing said protective layers to expose said end faces of said laser bar in said non-oxidizing chamber;

forming window layers on said exposed end faces maintained contamination free and oxide free, in said non-oxidizing chamber, each of said window layers being a single crystal semiconductor material which has a forbidden band larger than that of said active layer in the width.

7. The method as claimed in claim 6, wherein said non-oxidizing chamber is a chamber of a chloride vapor phase epitaxy apparatus.

8. The method as claimed in claim 6, wherein said single crystal semiconductor material is a compound semiconductor material between third and fifth group elements in the element periodic table.

9. The method as claimed in claim 8, wherein said active layer is of InGaAS, said window layer is of at least one material selected from a group of GaAs, AlGaAs, InGaP, AlGaInP, and GaP.

10. The method as claimed in claim 9, wherein said window layer is a multilayer comprising sublayers of at least two selected from a group of GaAs, AlGaAs, InGaP, AlGaInP, and GaP.

11. The method as claimed in claim 8, wherein said active layer is of GaAS, said window layer is of at least one material selected from a group of AlGaAs, InGaP, AlGaInP, and GaP.

12. The method as claimed in claim 11, wherein said window layer is a multilayer comprising sublayers of at least two selected from a group of AlGaAs, InGaP, AlGaInP, and GaP.

13. The method as claimed in claim 8, wherein said active layer is of InGaP, said window layer is of at least one material selected from a group of AlGaInP, and GaP.

14. The method as claimed in claim 13, wherein said window layer is a multilayer comprising sublayers of AlGaInP and GaP.

15. The method as claimed in claim 6, which further comprises a step of forming dielectric films on said window layers, respectively, first one of said dielectric films being of a first dielectric material providing a first light reflectance, the other of said dielectric films being of dielectric materials providing a second light reflectance higher than said first light reflectance.

16. The method as claimed in claim 15, wherein said first dielectric material is a single layer of one compound selected from a group of $Al_2O_3$, $SiN_4$, and $SiO_2$.

17. The method as claimed in claim 15, wherein said second dielectric film is a multilayer comprising a sublayer of $Al_2O_3$ and another sublayer of Si amorphous.

* * * * *